(12) United States Patent
Wang et al.

(10) Patent No.: US 11,081,421 B2
(45) Date of Patent: Aug. 3, 2021

(54) IGBT MODULE WITH HEAT DISSIPATION STRUCTURE HAVING CERAMIC LAYERS CORRESPONDING IN POSITION AND IN AREA TO CHIPS

(71) Applicant: AMULAIRE THERMAL TECHNOLOGY, INC., New Taipei (TW)

(72) Inventors: Tzu-Hsuan Wang, New Taipei (TW); Tze-Yang Yeh, New Taipei (TW); Chun-Lung Wu, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 7 days.

(21) Appl. No.: 16/711,830

(22) Filed: Dec. 12, 2019

(65) Prior Publication Data

US 2021/0183731 A1 Jun. 17, 2021

(51) Int. Cl.
*H01L 23/373* (2006.01)
*H01L 25/07* (2006.01)
*H01L 23/00* (2006.01)
*H01L 23/367* (2006.01)

(52) U.S. Cl.
CPC ...... *H01L 23/3735* (2013.01); *H01L 23/3672* (2013.01); *H01L 23/3737* (2013.01); *H01L 24/29* (2013.01); *H01L 24/32* (2013.01); *H01L 25/072* (2013.01); *H01L 2224/29082* (2013.01); *H01L 2224/32245* (2013.01); *H01L 2924/13055* (2013.01)

(58) Field of Classification Search
CPC ............. H01L 23/3735; H01L 23/3672; H01L 23/3737; H01L 24/29; H01L 24/32; H01L 25/072; H01L 29/7393; H01L 23/3731; H01L 23/367; H01L 23/50; H01L 23/49861; H01L 23/49833; H01L 23/53228; H01L 23/562; H01L 23/295; H01L 24/73; H01L 25/18; H01L 23/49568; H01L 21/50; H05K 7/209; H05K 1/0271; H05K 1/09; H05K 2201/0038; H05K 2201/0209; H05K 1/0272; H05K 1/056; C04B 37/006
USPC .... 257/717, 782, 684, 675, E23.01, E23.08; 438/122; 361/719; 523/210, 205
See application file for complete search history.

(56) References Cited

U.S. PATENT DOCUMENTS 6,114,413 A * 9/2000 Kang ..................... C08K 9/02
523/205
2007/0045801 A1* 3/2007 Sugiyama ............ H05K 1/0271
257/684

(Continued)

*Primary Examiner* — Mouloucoulaye Inoussa
(74) *Attorney, Agent, or Firm* — Li & Cai Intellectual Property (USA) Office

(57) ABSTRACT

An IGBT module with a heat dissipation structure includes a first layer of chips, a second layer of chips, a first bonding layer, a second bonding layer, a first copper layer, a second copper layer, a first polymer composite layer, a second polymer composite layer, a first ceramic layer, a second ceramic layer, and a heat dissipation layer. The first ceramic layer is partially formed on the heat dissipation layer and corresponds in position and in area to the first layer of chips, and the second ceramic layer is partially formed on the heat dissipation layer and corresponds in position and in area to the second layer of chips.

7 Claims, 3 Drawing Sheets

(56) References Cited

U.S. PATENT DOCUMENTS

| | | | |
|---|---|---|---|
| 2010/0002399 A1* | 1/2010 | Mori | H01L 23/367 |
| | | | 361/719 |
| 2010/0294545 A1* | 11/2010 | Massopust | H05K 3/363 |
| | | | 174/254 |
| 2011/0233758 A1* | 9/2011 | Machida | H01L 23/49575 |
| | | | 257/717 |
| 2014/0159216 A1* | 6/2014 | Ishino | H01L 23/3114 |
| | | | 257/675 |
| 2017/0117208 A1* | 4/2017 | Kasztelan | H01L 23/49551 |
| 2017/0309544 A1* | 10/2017 | Kobayashi | H01L 23/4334 |

* cited by examiner

IGBT MODULE WITH HEAT DISSIPATION STRUCTURE HAVING CERAMIC LAYERS CORRESPONDING IN POSITION AND IN AREA TO CHIPS

FIELD OF THE DISCLOSURE

The present disclosure relates to an IGBT (Insulated Gate Bipolar Transistor) module, and more particularly to an IGBT module with a heat dissipation structure having ceramic layers corresponding in position and in area to chips.

BACKGROUND OF THE DISCLOSURE

Most high-power inverters currently used in electric vehicles/hybrid vehicles adopt IGBT (Insulated Gate Bipolar Transistor) chips. Therefore, the heat generated by the high-power inverters during operation will cause the IGBT chip temperature to rise. If no proper heat dissipation measures are incorporated, the temperature of the IGBT chip may exceed the allowable temperature, resulting in deterioration of performance and damage. Therefore, the IGBT heat dissipating efficiency has become a major problem in the industry.

At present, the direct bonded copper (DBC) substrate has become the material of choice for IGBT heat dissipation structures. However, the DBC substrate is of a multilayer structure which has a limited ability of spreading heat. When heat is generated by the layer of IGBT chips, it cannot be transferred to the heat dissipation metal layer through the DBC substrate in time. Moreover, the connection between the DBC substrate and the heat dissipation metal layer can only be made through the solder layer. In practice, the entire solder layer is highly prone to experience an empty soldering phenomenon and causes an increase in interface impedance, thereby affecting the effectiveness of thermal conductivity.

Therefore, the inventor of the present disclosure has tried spraying ceramic material onto the surface of the heat dissipation metal layer in an attempt to form a whole layer of ceramic material to replace the solder layer and the DBC substrate. However, when a whole layer of ceramic material is heated, stress is generated due to the difference in thermal expansion coefficients of the metal and ceramic, and as the expansion of the metal is usually greater than that of the ceramic, a whole layer of ceramic material can easily break or crack.

SUMMARY OF THE DISCLOSURE

One objective of the present disclosure is to provide an IGBT module with a heat dissipation structure having ceramic layers corresponding in position and in area to chips that can overcome the aforementioned issues.

In one aspect, the present disclosure provides an IGBT module with a heat dissipation structure, including a first layer of chips, a second layer of chips, a first bonding layer, a second bonding layer, a first copper layer, a second copper layer, a first polymer composite layer, a second polymer composite layer, a first ceramic layer, a second ceramic layer, and a heat dissipation layer. The first ceramic layer and the second ceramic layer are formed on the heat dissipation layer. The first polymer composite layer and the second polymer composite layer are formed on the first ceramic layer and the second ceramic layer, respectively. The first copper layer and the second copper layer are formed on the first polymer composite layer and the second polymer composite layer, respectively. The first bonding layer and the second bonding layer are formed on the first copper layer and the second copper layer, respectively. The first layer of chips and the second layer of chips are formed on the first bonding layer and the second bonding layer, respectively. The first ceramic layer is partially formed on the heat dissipation layer and corresponds in position and in area to the first layer of chips, and the second ceramic layer is partially formed on the heat dissipation layer and corresponds in position and in area to the second layer of chips.

Preferably, the area of the first layer of chips is at least 60% of the area of the first ceramic layer.

Preferably, the area of the second layer of chips is at least 60% of the area of the second ceramic layer.

Preferably, a distance in a width direction between one side edge of the first layer of chips and a corresponding side edge of the first ceramic layer is 2 to 10 mm.

Preferably, a distance in a width direction between one side edge of the second layer of chips and a corresponding side edge of the second ceramic layer is 2 to 10 mm.

Preferably, the first ceramic layer has a thickness of about 20-500 μm.

Preferably, the second ceramic layer has a thickness of about 20-500 μm.

Preferably, the first polymer composite layer is an epoxy-based composite, a polyimide-based composite or a PP-based composite, and the first polymer composite layer has a thickness of about 20-200 μm.

Preferably, the first polymer composite layer includes at least one of the following fillers: alumina, aluminum nitride, silicon nitride, silicon carbide, or boron nitride.

Preferably, the second polymer composite layer is an epoxy-based composite, a polyimide-based composite or a PP-based composite, and the second polymer composite layer has a thickness of about 20-200 μm.

Preferably, the second polymer composite layer includes at least one of the following fillers: alumina, aluminum nitride, silicon nitride, silicon carbide, or boron nitride.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
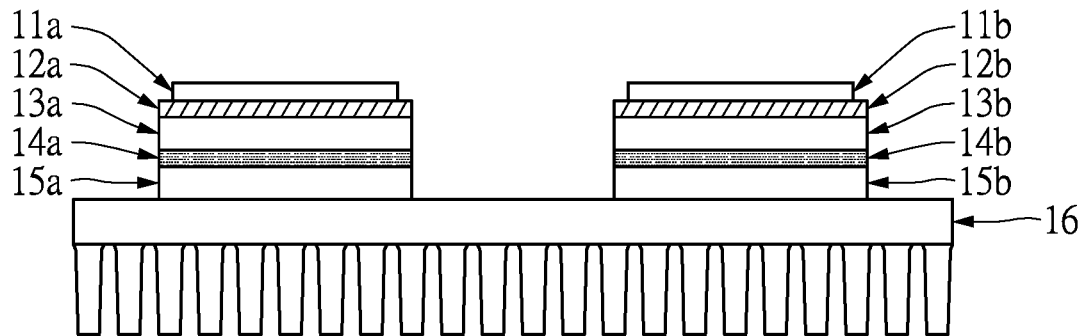
FIG. 1 is a side schematic view illustrating an IGBT module with a heat dissipation structure of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
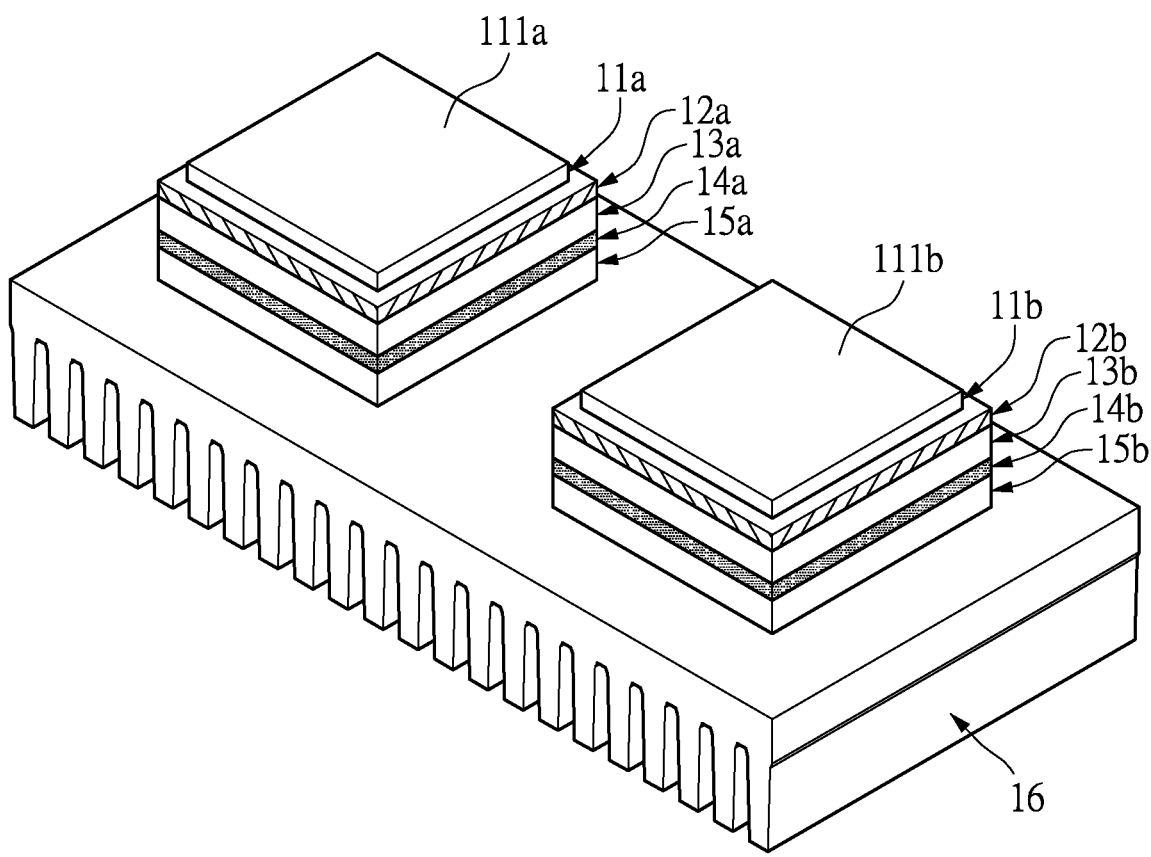
FIG. 2 is a perspective schematic view illustrating the IGBT module with a heat dissipation structure of the present disclosure.
Figure 3:
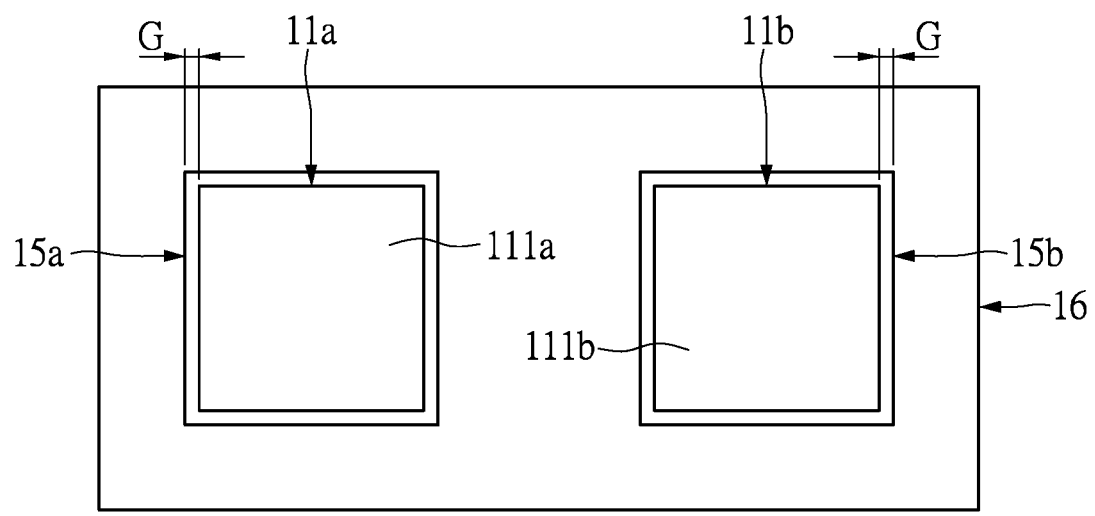
FIG. 3 is a top schematic view illustrating the IGBT module with a heat dissipation structure of the present disclosure.

Referring to FIG. 1 to FIG. 3, the present disclosure provides an IGBT module with a heat dissipation structure having ceramic layers corresponding to positions and areas of chips. As shown in FIG. 1 to FIG. 3, an IGBT module with a heat dissipation structure having ceramic layers corresponding to positions and areas of chips in accordance with the present disclosure includes a first layer 11a of chips, a second layer 11b of chips, a first bonding layer 12a, a second bonding layer 12b, a first copper layer 13a, a second copper layer 13b, a first polymer composite layer 14a, a second polymer composite layer 14b, a first ceramic layer 15a, a second ceramic layer 15b, and a heat dissipation layer 16.

The first ceramic layer 15a and the second ceramic layer 15b are each partially formed on the heat dissipation layer 16. The heat dissipation layer 16 can be a heat sink or a heat dissipation metal plate, but is not limited thereto. The first and second ceramic layers 15a, 15b are formed by utilizing the plasma spraying process, which raises the ceramic powder from a normal temperature to a high temperature of 2500 degrees Celsius or higher by the high heat generated by a plasma torch, thereby causing the ceramic powder to be converted from a solid state to a molten liquid state. The molten ceramic is then blown by a high-velocity plasma gas, atomized, and sprayed on the surface of the heat dissipation layer 16 to form spray layers each having a predetermined thickness. The plasma gas used in the present embodiment is argon; however, nitrogen, hydrogen, and other gases may also be used.

Furthermore, the ceramic material of the first and second ceramic layers 15a, 15b can be selected from aluminum oxide, but it can also be selected from aluminum nitride or silicon nitride. In addition, the thicknesses of the first and second ceramic layers 15a, 15b may be set in advance according to the spraying time of the spray coating on the surface of the heat dissipation layer 16. In the present embodiment, the first and second ceramic layers 15a, 15b each has a thickness of about 20-300 μm.

The first polymer composite layer 14a and the second polymer composite layer 14b are formed on the first ceramic layer 15a and the second ceramic layer 15b, respectively. The first and second polymer composite layers 14a, 14b are each composed of polymer composite material and can achieve the effects of heat conduction and bonding. Therefore, compared to a conventional IGBT module with a heat dissipation structure that requires a solder layer to form a connection between the DBC substrate and the heat dissipation layer, the structure in accordance with the present disclosure does not need a solder layer but instead directly forms the first and second ceramic layers 15a, 15b on the surface of the heat dissipation layer 16 for heat conduction and insulation, as well as forming the first and second polymer composite layers 14a, 14b on the surfaces of the first and second ceramic layers 15a, 15b, respectively, for heat conduction and bonding.

In detail, the first and second polymer composite layers 14a, 14b may each be an epoxy-based composite. Furthermore, the first and second polymer composite layers 14a, 14b may each include at least one of the following fillers: alumina, aluminum nitride, silicon nitride, silicon carbide, or boron nitride. In other embodiments, the first and second polymer composite layers 14a, 14b may each be composed of an epoxy-based composite, a polyimide-based composite, or a PP-based composite. Moreover, the first and second polymer composite layers 14a, 14b may be bonded onto the first and second ceramic layers 15a, 15b, respectively, by screen-printing or hot-pressing. In the present embodiment, the first and second polymer composite layers 14a, 14b each has a thickness of about 20-200 μm.

The first copper layer 13a and the second copper layer 13b are formed on the first polymer composite layer 14a and the second polymer composite layer 14b, respectively, so that the first copper layer 13a and the second copper layer 13b can form good bonding with the first ceramic layer 15a and the second ceramic layer 15b, respectively, through the first polymer composite layer 14a and the second polymer composite layer 14b.

The first copper layer 13a and the second copper layer 13b may each be a thin copper block, but may also be a thick copper block, and are formed on the first polymer composite layer 14a and the second polymer composite layer 14b, respectively, by hot-pressing.

The first bonding layer 12a and the second bonding layer 12b are formed on the first copper layer 13a and the second copper layer 13b, respectively. Furthermore, the first layer 11a of chips and the second layer 11b of chips are formed on the first bonding layer 12a and the second bonding layer 12b, respectively. The first bonding layer 12a and the second bonding layer 12b may each be, but not limited to, a tin bonding layer, a sintered silver layer, and/or the like.

In the present embodiment, the first layer 11a of chips is, for example, a layer of an IGBT chip 111a. Furthermore, the first ceramic layer 15a is partially formed on the heat dissipation layer 16 and corresponds to the position and area of the first layer 11a of chips, i.e., it corresponds to the position and area of the IGBT chip 111a. The first ceramic layer 15a has a small area and is partially formed on the heat dissipation layer while corresponding in position and in area to the IGBT chip 111a, which can reduce the probability of cracks being formed on the first ceramic layer 15a from stress when heated.

In like manner, the second layer 11b of chips is, for example, a layer of an IGBT chip 111b. Furthermore, the second ceramic layer 15b is partially formed on the heat dissipation layer 16 and corresponds to the position and area of the second layer 11b of chips, i.e., it corresponds to the position and area of the IGBT chip 111b. The second ceramic layer 15b has a small area and is partially formed on the heat dissipation layer while corresponding in position and in area to the IGBT chip 111b, which can reduce the probability of cracks being formed on the second ceramic layer 15b from stress when heated.

Therefore, compared with the conventional IGBT module with a heat dissipation structure where the ceramic material is sprayed on the whole surface of the heat dissipation metal layer to form a whole ceramic layer, causing the whole ceramic layer to easily crack due to stress when heated, the present disclosure is to, in small areas and partially, spray the ceramic material on the surface of the heat dissipation metal layer to form ceramic layers, and the areas and positions of the spraying correspond to the areas and positions of chips, so that the probability of the ceramic layers cracking or breaking due to stress when heated can be reduced.

Further, the area of the first layer 11a of chips may be, or may cover at least 60% of the area of the first ceramic layer 15a, and preferably 90% thereof. In addition, the area of the second layer 11b of chips may be, or may cover at least 60% of the area of the second ceramic layer 15b, and preferably 90% thereof.

Furthermore, as shown in FIG. 3, the distance G in a width direction between one side edge of the first layer 11a of chips and the corresponding side edge of the first ceramic layer 15a can be 2 to 10 mm. In addition, the distance G in a width direction between one side edge of the second layer 11b of chips and the corresponding side edge of the second ceramic layer 15b can be 2 to 10 mm.

Figure 4:
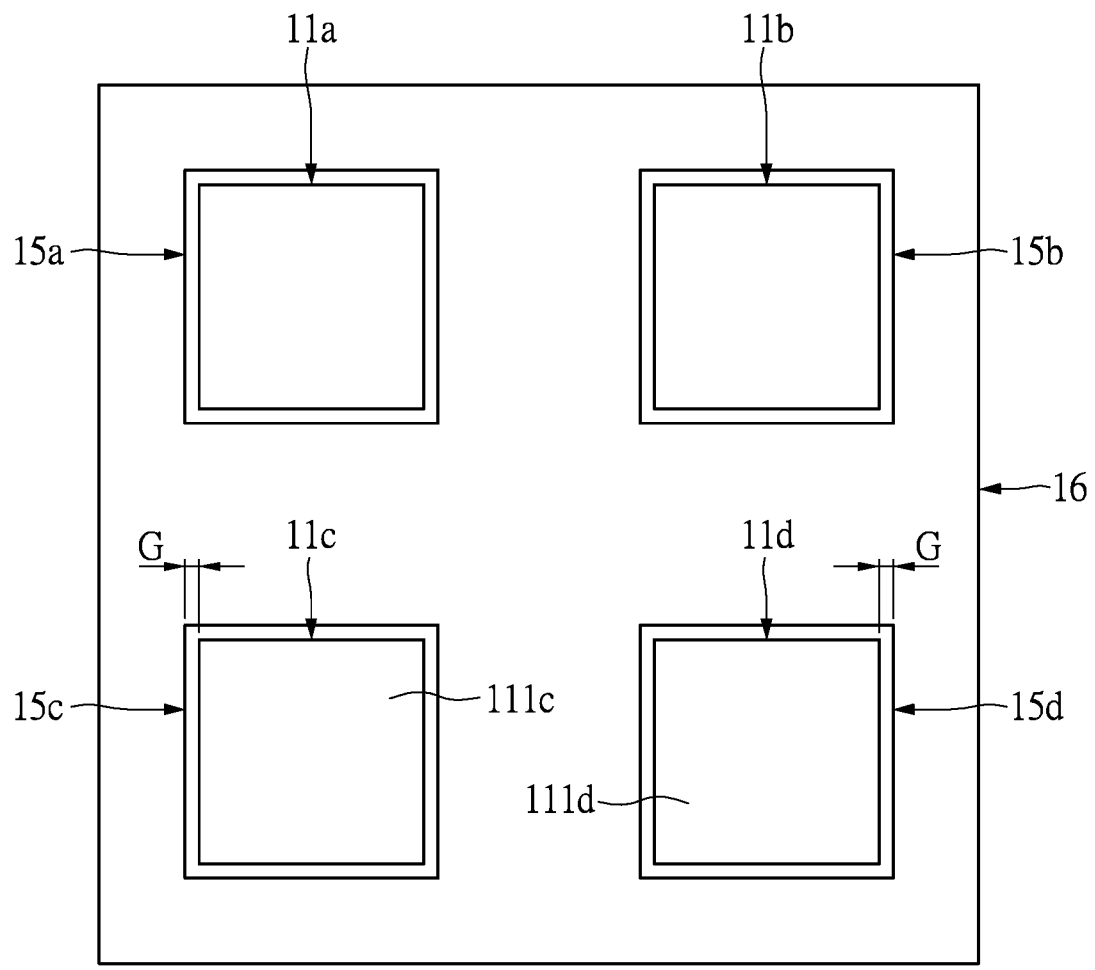
FIG. 4 is a top schematic view illustrating another IGBT module with a heat dissipation structure of the present disclosure.

Referring to FIG. 4, the present disclosure provides another IGBT module with a heat dissipation structure having ceramic layers corresponding to positions and areas of chips. As shown in FIG. 4, the IGBT module with a heat dissipation structure having ceramic layers corresponding to positions and areas of chips in accordance with the present disclosure further includes a third layer 11c of chips, a fourth layer 11d of chips, a third ceramic layer 15c, and a fourth ceramic layer 15d.

In the present embodiment, the third layer 11c of chips is, for example, a layer including an IGBT chip 111c. Furthermore, the third ceramic layer 15c is partially formed on the heat dissipation layer 16 and corresponds to the position and area of the third layer 11c of chips, i.e., it corresponds to the position and area of the IGBT chip 111c. The distance G between one side edge of the third layer 11c of chips and the corresponding side edge of the third ceramic layer 15c can be 2 to 10 mm.

In like manner, the fourth layer 11d of chips is, for example, a layer including an IGBT chip 111d. Furthermore, the fourth ceramic layer 15d is partially formed on the heat dissipation layer 16 and corresponds to the position and area of the fourth layer 11d of chips, i.e., it corresponds to the position and area of the IGBT chip 111d. The distance G between one side edge of the fourth layer 11d of chips and the corresponding side edge of the fourth ceramic layer 15d can be 2 to 10 mm.

In summary, the present disclosure provides an IGBT module with a heat dissipation structure having ceramic layers corresponding in position and in area to chips. The first ceramic layer is partially formed on the heat dissipation layer and corresponds in position and in area to the first layer of chips, and the second ceramic layer is partially formed on the heat dissipation layer and corresponds in position and in area to the second layer of chips. Compared with the conventional IGBT module with a heat dissipation structure where the ceramic material is sprayed on the surface of the heat dissipation metal layer to form a whole ceramic layer, causing the whole ceramic layer to easily crack or break due to stress when heated, the present disclosure is to, in small areas and partially, spray the ceramic material on the surface of the heat dissipation metal layer to form ceramic layers, and the areas and positions of the spraying correspond to the areas and positions of chips, so that the probability of the ceramic layers cracking or breaking due to stress when heated can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An IGBT module with a heat dissipation structure, comprising: a first layer of chips, a second layer of chips, a first bonding layer, a second bonding layer, a first copper layer, a second copper layer, a first polymer composite layer, a second polymer composite layer, a first ceramic layer, a second ceramic layer, and a one-piece heat dissipation layer; wherein the first ceramic layer and the second ceramic layer are formed on the one-piece heat dissipation layer, the first polymer composite layer and the second polymer composite layer are formed on the first ceramic layer and the second ceramic layer, respectively, the first copper layer and the second copper layer are formed on the first polymer composite layer and the second polymer composite layer, respectively, the first bonding layer and the second bonding layer are formed on the first copper layer and the second copper layer, respectively, the first layer of chips and the second layer of chips are formed on the first bonding layer and the second bonding layer, respectively; and wherein the first ceramic layer is sprayed partially on the one-piece heat dissipation layer and corresponds in position and in area to the first layer of chips, and the second ceramic layer is sprayed partially on the one-piece heat dissipation layer and corresponds in position and in area to the second layer of chips; wherein, an area of the first layer of chips is greater than 60% and less than 90% of an area of the first ceramic layer; wherein, a distance in a width direction between one side edge of the first layer of chips and a corresponding side edge of the first ceramic layer is 2 to 10 mm; wherein, an area of the second layer of chips is greater than 60% and less than 90% of an area of the second ceramic layer; and wherein, a distance in a width direction between one side edge of the second layer of chips and a corresponding side edge of the second ceramic layer is 2 to 10 mm.

2. The IGBT module with the heat dissipation structure according to claim 1, wherein the first ceramic layer has a thickness of 20-500 μm.

3. The IGBT module with the heat dissipation structure according to claim 2, wherein the second ceramic layer has a thickness of 20-500 μm.

4. The IGBT module with the heat dissipation structure according to claim 1, wherein the first polymer composite layer is an epoxy-based composite, a polyimide-based composite or a PP-based composite, and the first polymer composite layer has a thickness of 20-200 μm.

5. The IGBT module with the heat dissipation structure according to claim 4, wherein the first polymer composite layer includes at least one of the following fillers: alumina, aluminum nitride, silicon nitride, silicon carbide, or boron nitride.

6. The IGBT module with the heat dissipation structure according to claim 4, wherein the second polymer composite layer is an epoxy-based composite, a polyimide-based composite or a PP-based composite, and the second polymer composite layer has a thickness of 20-200 μm.

7. The IGBT module with the heat dissipation structure according to claim 6, wherein the second polymer composite layer includes at least one of the following fillers: alumina, aluminum nitride, silicon nitride, silicon carbide, or boron nitride.

* * * * *